(12) United States Patent
Yu et al.

(10) Patent No.: US 7,838,334 B2
(45) Date of Patent: Nov. 23, 2010

(54) PACKAGE-ON-PACKAGE DEVICE, SEMICONDUCTOR PACKAGE AND METHOD FOR MANUFACTURING THE SAME

(75) Inventors: Lin Wang Yu, Bancaio (TW); Cheng Yi Weng, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 12/565,501

(22) Filed: Sep. 23, 2009

(65) Prior Publication Data
US 2010/0133675 A1 Jun. 3, 2010

(30) Foreign Application Priority Data
Dec. 1, 2008 (TW) .............................. 97146551 A

(51) Int. Cl.
*H01L 21/00* (2006.01)
(52) U.S. Cl. ................. 438/107; 438/67; 438/108; 438/118; 438/127; 257/E21.499; 257/E21.503; 257/E21.705
(58) Field of Classification Search ................. 438/55; 257/E21.5, E21.512
See application file for complete search history.

(56) References Cited

U.S. PATENT DOCUMENTS

| 2003/0205826 A1* | 11/2003 | Lin et al. ..................... 257/777 |
| 2006/0244157 A1* | 11/2006 | Carson ....................... 257/787 |
| 2009/0236718 A1* | 9/2009 | Yang et al. .................. 257/686 |
| 2009/0236735 A1* | 9/2009 | Corisis et al. ............... 257/723 |
| 2010/0038772 A1* | 2/2010 | Taguchi et al. .............. 257/698 |

* cited by examiner

*Primary Examiner*—Charles D Garber
*Assistant Examiner*—Cheung Lee

(57) ABSTRACT

A semiconductor package includes a substrate, a chip, an interposer and a molding compound. The chip is electrically connected to the upper surface of the substrate. The interposer is disposed on the chip, and electrically connected to the upper surface of the substrate. The interposer includes an embedded component and a plurality of electric contacts, wherein the embedded component is located between the upper and lower surfaces of the interposer, and the electric contacts are located on the upper surface of the interposer. The molding compound seals the chip and covers the upper surface of the substrate and the lower surface of the interposer.

20 Claims, 7 Drawing Sheets

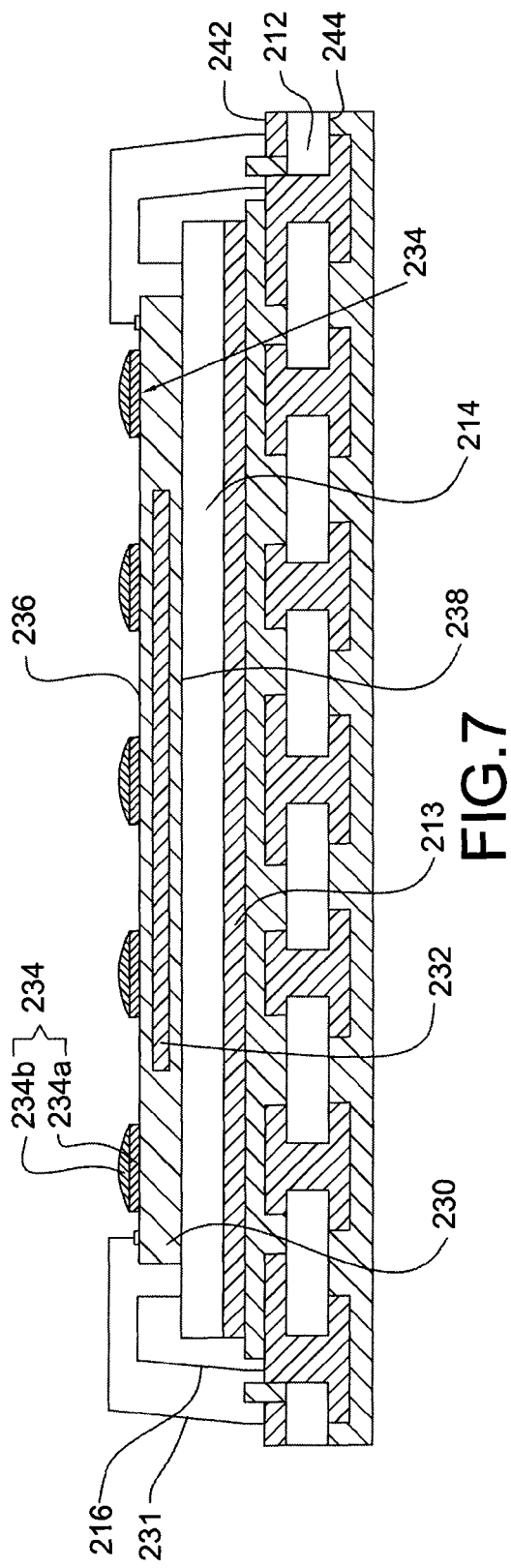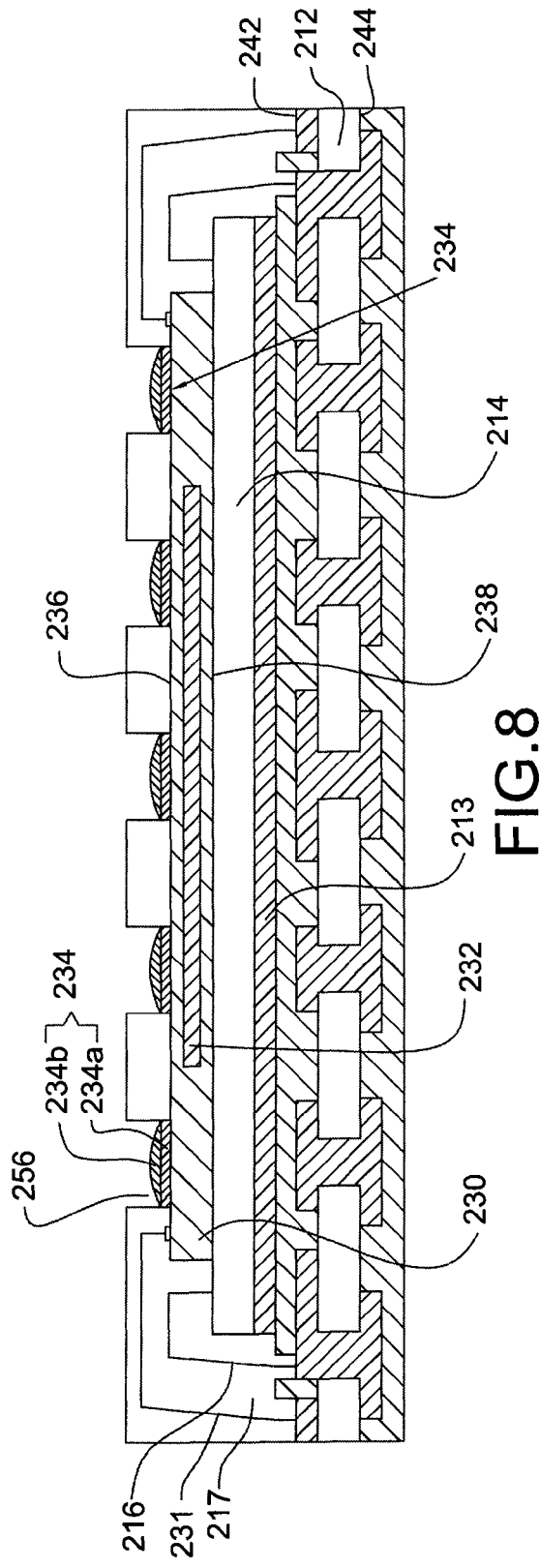

US 7,838,334 B2

PACKAGE-ON-PACKAGE DEVICE, SEMICONDUCTOR PACKAGE AND METHOD FOR MANUFACTURING THE SAME

CROSS REFERENCE TO RELATED APPLICATION

This application claims the priority benefit of Taiwan Patent Application Serial Number 097146551, filed on Dec. 1, 2008, the full disclosure of which is incorporated herein by reference.

BACKGROUND OF THE INVENTION

1. Field of the Invention

The present invention generally relates to a stacked package device, and more particularly to a bottom package of a stacked package device including an interposer.

2. Description of the Related Art

Currently, a package-on-package (hereinafter referred to as POP) device is related to a semiconductor package disposed on another semiconductor package. The basic object of the POP device is to increase the density of components so as to result in more functions of components per unit volume and better regional efficiency. Thus, the total area of the POP device can be decreased, and the cost is reduced simultaneously.

FIG. 1 is a diagrammatic sketch in a sectional view illustrating the structure of an example of a conventional stacked package (i.e. package-on-package, POP) device 50, i.e. a two-stack multi-package module (MPM), in which the interconnection is made by solder balls 28. In this POP device 50, a first package is the "top" package 20, and a second package is the "bottom" package 10. The top package 20 is stacked on the bottom package 10. The top package 20 includes a chip 24 attached onto the substrate 22. The substrate 22 of the top package 20 has upper and lower metal layers patterned to provide appropriate circuitry and connected by way of vias. The chip 24 is attached on an upper surface of the substrate 22 by using an adhesive 23, e.g. die attach epoxy. The bottom package 10 includes a chip 14 attached onto a substrate 12. The substrate 12 of the bottom package 10 also has upper and lower metal layers patterned to provide appropriate circuitry and connected by way of vias. The chip 14 is attached on an upper surface of the substrate 12 by using an adhesive 13, e.g. die attach epoxy.

In the top and bottom packages 20, 10, the chips 24, 14 are respectively bonded to wire bond sites 25, 15 on the upper metal layer of the substrate 22, 12 by means of bonding wires 26, 16, so as to establish electrical connections. The chips 24, 14 and the bonding wires 26, 16 are respectively encapsulated with top and bottom molding compound 27, 17. Solder balls 28 are mounted onto bonding pads located on the peripheral margin of a lower surface of the substrate 22 to provide interconnection to the bottom package 10. Solder balls 18 are mounted onto bonding pads located on a lower surface of the substrate 12 to provide electrical connection to an external circuit board (not shown).

The interconnection between the top and bottom packages 20, 10 of the POP device 50 is achieved by reflowing the solder balls 28 attached to the bonding pads located on the peripheral margin of the lower surface of the substrate 22 of the top package 20 and attached to the bonding pads located on the peripheral margin of the upper surface of the substrate 12 of the bottom package 10.

However, the conventional POP device has not any interposer or substrate which is disposed between the top and bottom packages 20, 10 for providing the electrical connection or more functions.

Accordingly, there exists a need for a stacked package device capable of solving the above-mentioned problems.

SUMMARY OF THE INVENTION

The present invention provides a bottom package of a stacked package (i.e. package-on-package, POP) device, which includes a substrate, a chip, an interposer and a molding compound. The substrate has an upper surface and a lower surface opposite to the upper surface. The chip is electrically connected to the upper surface of the substrate. The interposer is disposed on the chip, and electrically connected to the upper surface of the substrate. The interposer includes an embedded component and a plurality of electric contacts, wherein the embedded component is located between the upper and lower surfaces of the interposer, and the electric contacts are located on the upper surface of the interposer. The molding compound seals the chip and covers the upper surface of the substrate and the lower surface of the interposer.

According to the POP device of the embodiment of the prevent invention, the interposer can provide the bottom and top packages with electrical connection, and the interposer can provide more functions.

The foregoing, as well as additional objects, features and advantages of the invention will be more apparent from the following detailed description, which proceeds with reference to the accompanying drawings.

BRIEF DESCRIPTION OF THE DRAWINGS

FIGS. 5 to 9 are cross-sectional views showing a method for manufacturing a bottom package of the stacked package device according to the embodiment of the present invention.

DETAILED DESCRIPTION OF THE PREFERRED EMBODIMENT

Figure 1:
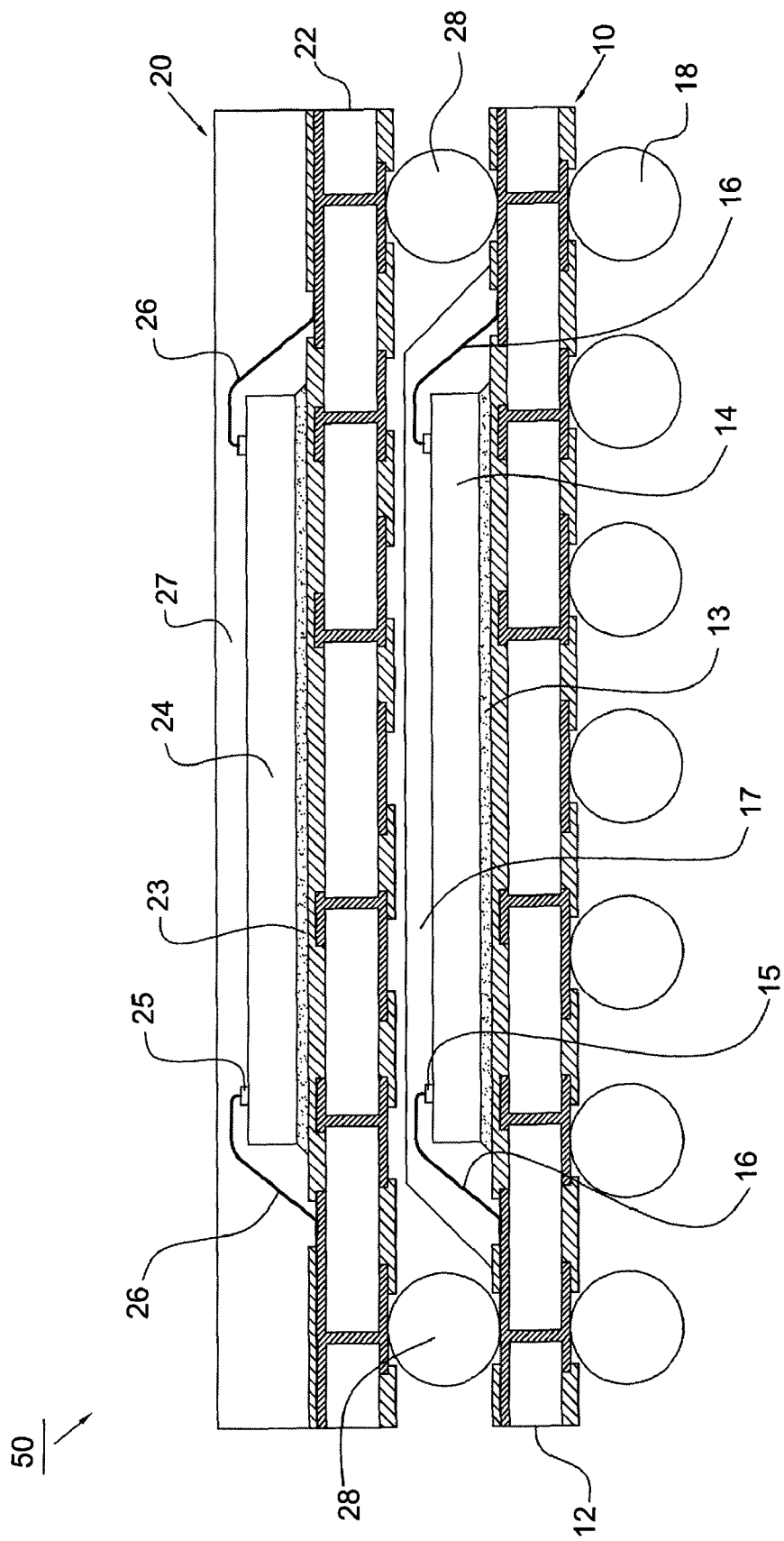
FIG. 1 is a cross-sectional view of a stacked package device in the prior art.
Figure 2:
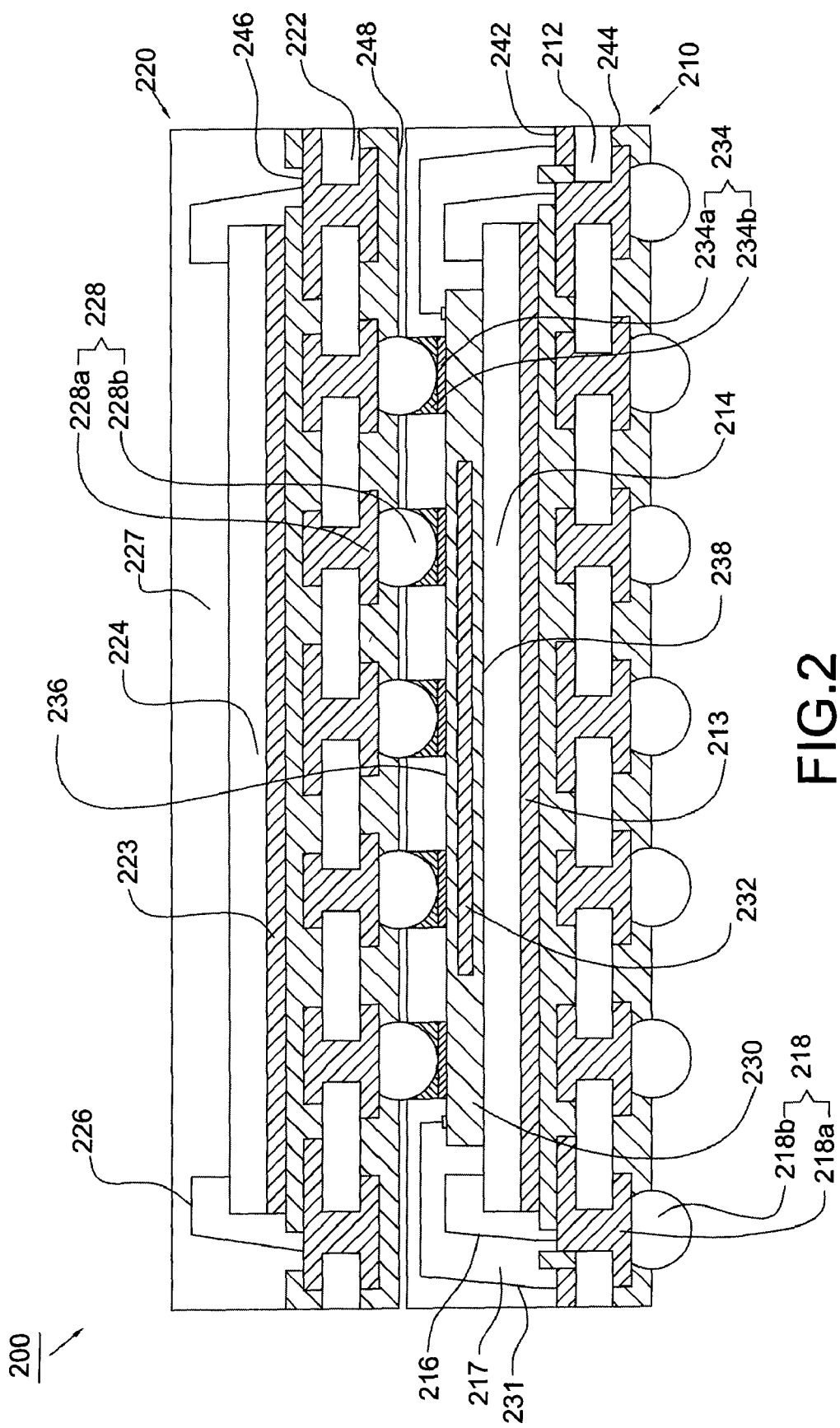
FIG. 2 is cross-sectional view of a stacked package device according to an embodiment of the present invention.

Referring to FIG. 2, it depicts a stacked package (i.e. package-on-package, POP) device 200 according to an embodiment of the present invention. The POP device 200 includes a top package 220 and a bottom package 210.

Figure 3:
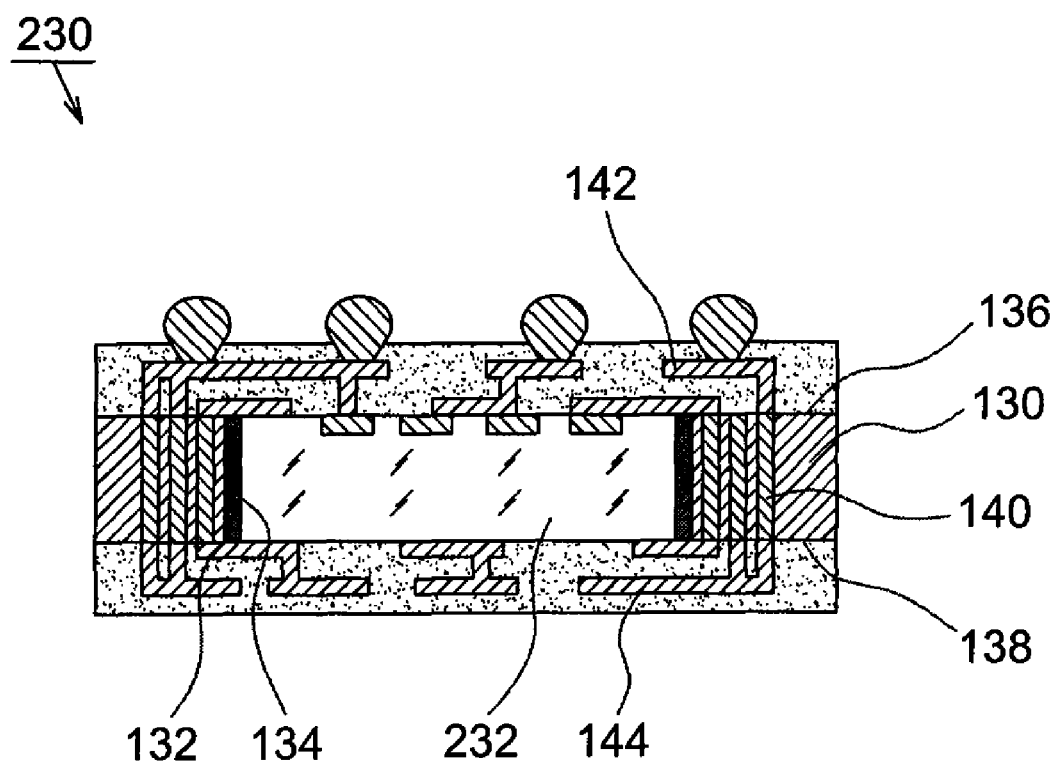
FIG. 3 is cross-sectional view of an interposer according to the embodiment of the present invention.

The bottom package 210 includes a first chip 214 mounted and electrically connected to an upper surface 242 of a first substrate 212. The first substrate 212 of the bottom package 210 has upper and lower metal layers which can be patterned to provide appropriate circuitry and electrically connected by way of vias. An interposer 230 is disposed on the first chip 214 and electrically connected to the upper surface 242 of the first substrate 212. Referring to FIG. 3, the interposer 230 can be a multi-layer circuit substrate or a silicon substrate with circuit formed therein. For example, a silicon substrate 130 has an upper surface 136 and a lower surface 138. An embedded component 232 is disposed within an opening 132 of the silicon substrate 130 and secured by a molding compound material 134, and is located between the upper and lower surfaces 136, 138. Circuit layers 142, 144 are formed on the upper and lower surfaces 136, 138 by a re-distribution layer (RDL) process. The silicon substrate 130 includes a plurality of through via 140 extended from the upper surface 136 to the lower surface 138 for electrically connecting the circuit layers to each other. Referring to FIG. 2 again, the interposer 230 has an upper surface 236 and a lower surface 238. The lower surface 238 is opposite to the upper surface 236 and faces the first chip 214. The interposer 230 includes an embedded component 232 and a plurality of electric contacts 234, wherein the embedded component 232 is located between the upper and lower surfaces 236, 238, and the electric contacts 234 are located on the upper surface 236 of the interposer 230. In this embodiment, the electric contact 234 includes a pad 234a and a pre-solder 234b disposed on the pad 234a. Or, in another embodiment the electric contact 234 includes a pad 234a and a solder ball (not shown) disposed on the pad 234a. A plurality of bonding wires 231 are adapted to electrically connect the interposer 230 to the upper surface 242 of the first substrate 212. The embedded component 232 can be an active component (e.g. chip) or a passive component (e.g. capacitor). A first molding compound 217 seals the first chip 214 and the bonding wires 231 and covers the upper surface 242 of the first substrate 212 and the lower surface 238 of the interposer 230. The first molding compound 217 exposes the lower surface 244 of the first substrate 212 and the electrical contacts 234 of the interposer 230.

The top package 220 is stacked on the bottom package 210. The top package 220 includes a second chip 224 mounted and electrically connected to an upper surface 246 of the second substrate 222. A lower surface 248 of the second substrate 222 is electrically connected to the electrical contacts 234 of the interposer 230. The second substrate 222 of the top package 220 also has upper and lower metal layers which can be patterned to provide appropriate circuitry and electrically connected by way of vias. A second molding compound 227 seals the second chip 224 and covers the upper surface 246 of the second substrate 222. The second molding compound 227 exposes the lower surface 248 of the second substrate 222.

According to the bottom package 210 and the top package 220, in this embodiment the first and second chips 214, 224 are mounted on the upper surfaces 242, 246 of the first and second substrates 212, 222 by adhesives 213, 223 e.g. die attach epoxy, respectively. Also, the first and second chips 214, 224 are electrically connected to the upper surfaces 242, 246 of the first and second substrates 212, 222 by bonding wires 216, 226, respectively. The bonding wires 216, 226 are also sealed by the first and second molding compounds 217, 227, respectively. Or, in an alternative embodiment the first and second chips 214, 224 are bonded to the upper surfaces 242, 246 of the first and second substrates 212, 222 by bumps (not shown), respectively.

Referring to FIG. 2 again, a plurality of electrical contacts 228 (e.g. the combination of solder balls 228b and pads 228a) are formed on the lower surface 248 of the second substrate 222 for electrically connecting to the electrical contacts 234 of the interposer 230 of the bottom package 210. Thus, the interconnection between the top and bottom packages 220, 210 of the POP device 200 is achieved. A plurality of electrical contacts 218 (e.g. the combination of solder balls 218b and pads 218a) are formed on the lower surface 244 of the first substrate 212 for electrically connecting to an external circuit board (not shown).

Figure 4:
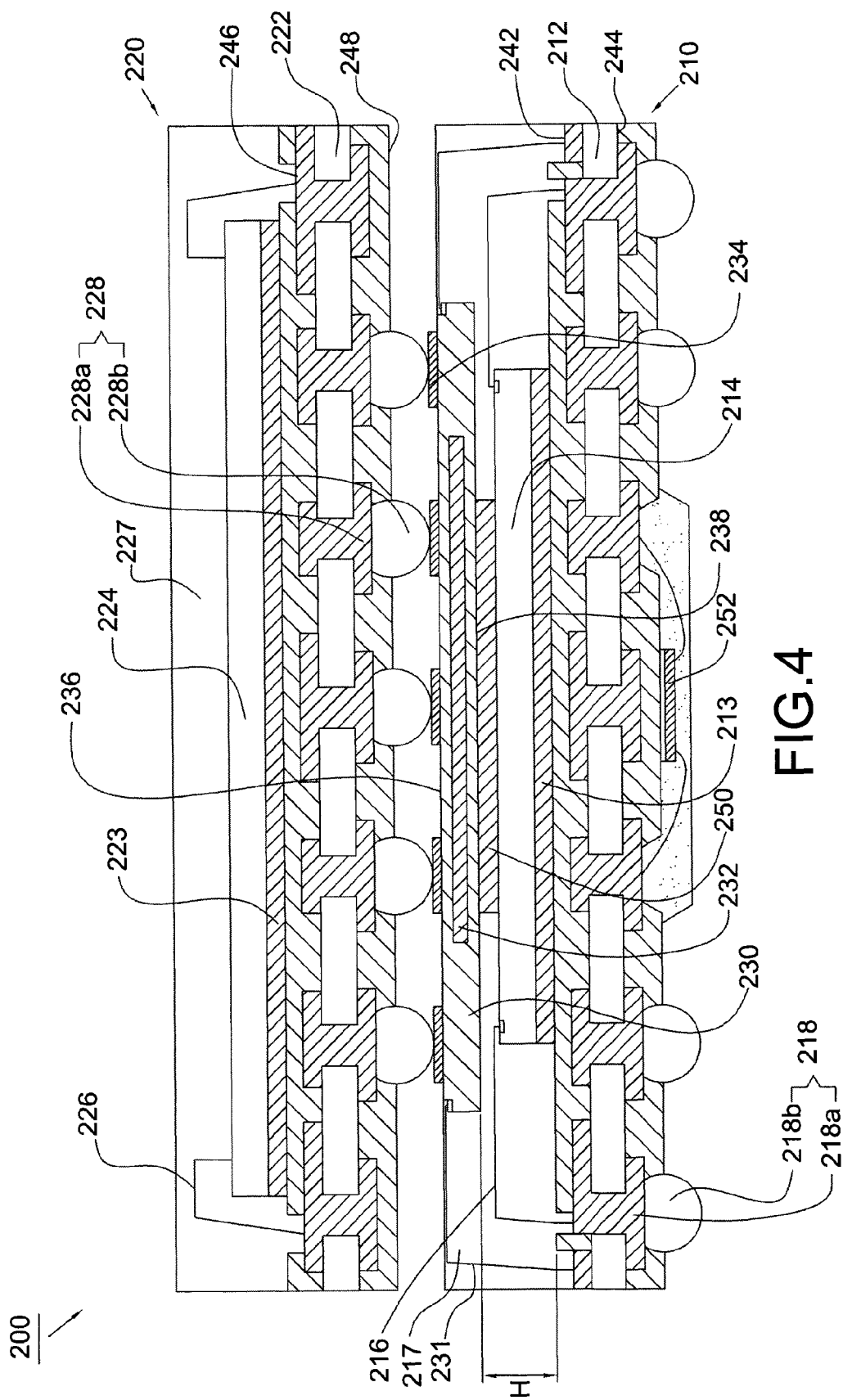
FIG. 4 is cross-sectional view of a stacked package device according to another embodiment of the present invention.

Referring to FIG. 4, in another embodiment a spacer 250 can be disposed between the first chip 214 and the interposer 230, when the size of the interposer 230 is greater than that of the first chip 214, whereby there is a predetermined gap H between the first substrate 212 and the interposer 230. The predetermined gap H is greater than the height of the bonding wires 216 so as to prevent the interposer 230 from touching the bonding wires 216. Furthermore, the first molding compound 217 can expose the upper surface 236 of the interposer 230 for dissipating the heat of the interposer 230. The electrical contact 234 only includes a pad (e.g. ball-shaped pad). A third chip 252 can be mounted and electrically connected to the lower surface 244 of the first substrate 212 by means of wire bonding process or flip chip bonding process, thereby providing more functions. A plurality of electrical contacts 218 (e.g. the combination of solder balls 218b and pads 218a) are formed on the lower surface 244 of the first substrate 212, i.e. the solder balls 218b is disposed on the lower surface 224 of the substrate 212 for electrically connecting to an external circuit board (not shown).

According to the POP device of the embodiment of the prevent invention, the interposer can provide the bottom and top packages with electrical connection, and the interposer can provide more functions.

Figure 5:
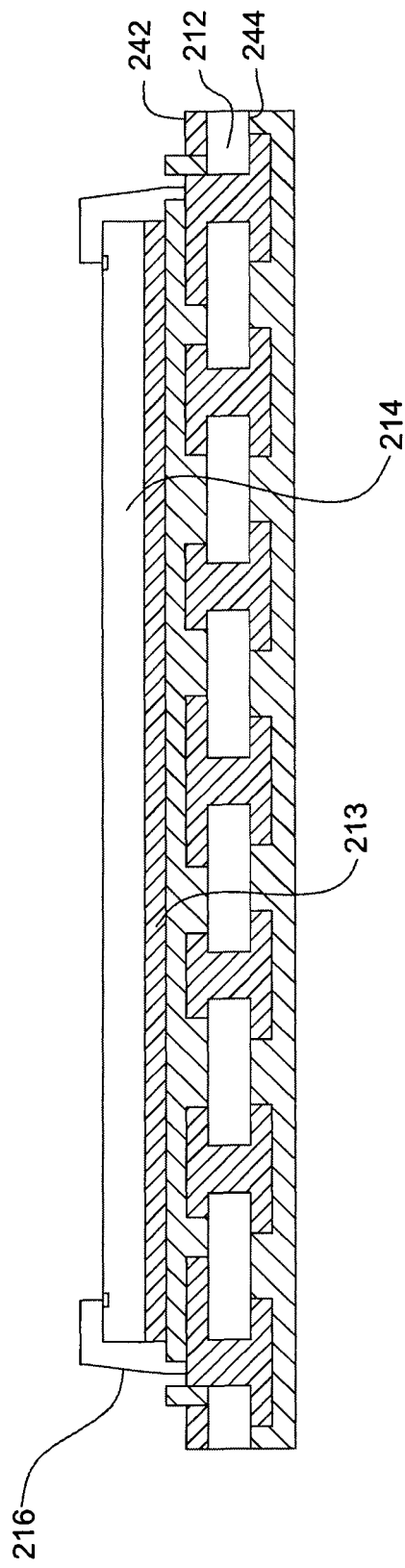
Figure 6:
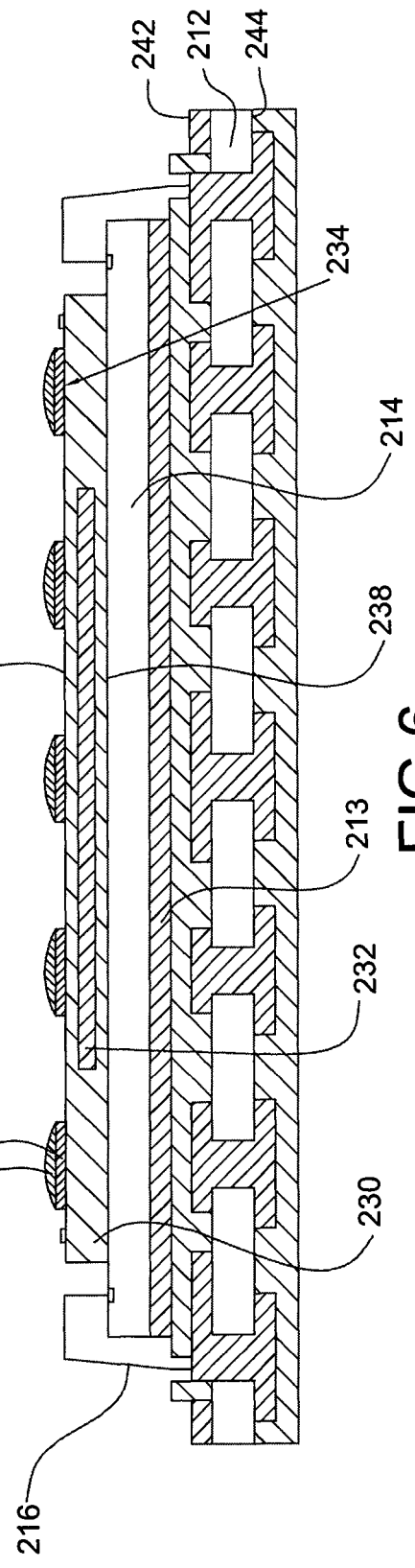
Figure 9:
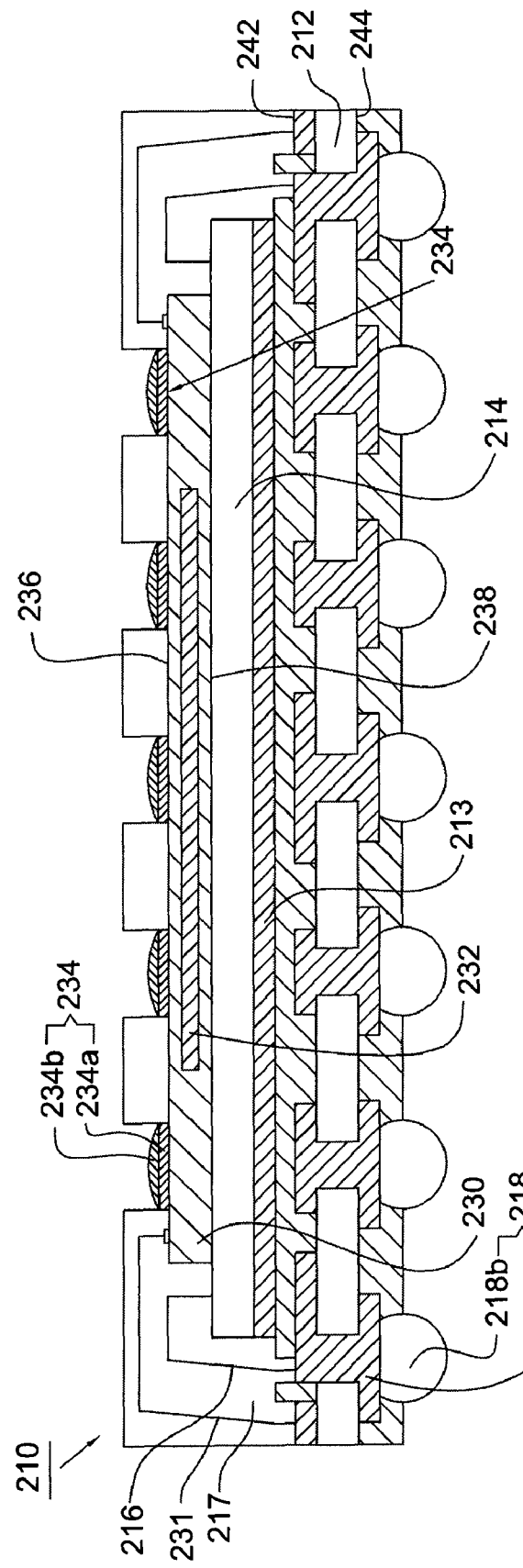

Referring to FIGS. 5 to 9, they depict a method for manufacturing the bottom package (e.g. semiconductor package) 210 of the POP device 200 of the embodiment of the prevent invention. Referring to FIG. 5, a substrate 212 is provided, wherein the substrate 212 has an upper surface 242 and a lower surface 244 opposite to the upper surface 242. In this embodiment, a chip 214 can be mounted and electrically connected to the upper surface 242 of the substrate 212 by means of a wire bonding process. Referring to FIG. 6, an interposer 230 is disposed on the chip 214 and electrically connected to the substrate 212, wherein the interposer 230 has an upper surface 236 and a lower surface 238, and the lower surface 238 is opposite to the upper surface 236 and faces the chip 214. The interposer 230 includes an embedded component 232 and a plurality of electric contacts 234, wherein the embedded component 232 is located between the upper and lower surfaces 236, 238, and the electric contacts 234 are located on the upper surface 236 of the interposer 230. In this embodiment, the electric contact 234 includes a pad 234a and a pre-solder 234b disposed on the pad 234a. Referring to FIG. 7, a plurality of bonding wires 231 are provided for electrically connecting the interposer 230 to the upper surface 242 of the substrate 212. Referring to FIG. 8, a molding compound 217 is applied or molded on the upper surface 242 of the substrate 212 to seal the chip 214 and the bonding wires 231 and to cover the lower surface 238 of the interposer 230. The molding compound 217 exposes the lower surface 244 of the substrate 212. Furthermore, a plurality of via holes 256 are formed in the molding compound 217 by a drilling process (e.g. laser drilling process), thereby exposing the electric contacts 234 of the interposer 230. Referring to FIG. 9, finally a plurality of solder balls 218b are mounted on pads 218a located on the lower surface 244 of the substrate 212 so as to form the bottom package 210 of the prevent invention.

Although the invention has been explained in relation to its preferred embodiment, it is not used to limit the invention. It is to be understood that many other possible modifications and variations can be made by those skilled in the art without departing from the spirit and scope of the invention as hereinafter claimed.

What is claimed is:
1. A semiconductor package comprising:
   a substrate having an upper surface and a lower surface opposite to the upper surface;
   a chip electrically connected to the upper surface of the substrate;

an interposer disposed on the chip and electrically connected to the substrate, wherein the interposer has an upper surface and a lower surface, the lower surface is opposite to the upper surface and faces the chip, the interposer comprises an embedded component and a plurality of first electric contacts, the embedded component is located between the upper and lower surfaces of the interposer, and the first electric contacts are located on the upper surface of the interposer, the interposer further comprises a silicon substrate and a molding compound material, the silicon substrate includes an opening, the embedded component is disposed within the opening and secured by the molding compound material, and the interposer further comprises upper circuit layers formed on the upper surface; and a molding compound sealing the chip and covering the upper surface of the substrate and the lower surface of the interposer.

2. The semiconductor package as claimed in claim 1, further comprising:
a plurality of first bonding wires adapted to electrically connect the interposer to the upper surface of the substrate.

3. The semiconductor package as claimed in claim 1, further comprising:
a plurality of second bonding wires adapted to electrically connect the chip to the substrate.

4. The semiconductor package as claimed in claim 3, further comprising:
a spacer disposed between the chip and the interposer, whereby there is a predetermined gap between the substrate and the interposer, wherein the predetermined gap is greater than the height of the second bonding wires.

5. The semiconductor package as claimed in claim 4, wherein the size of the interposer is greater than that of the chip.

6. The semiconductor package as claimed in claim 1, wherein the interposer is one of a multi-layer circuit substrate and a silicon substrate with circuit formed therein.

7. The semiconductor package as claimed in claim 1, wherein the embedded component is an active component.

8. The semiconductor package as claimed in claim 1, wherein the embedded component is a passive component.

9. The semiconductor package as claimed in claim 1, wherein the first electric contact comprises a pad.

10. The semiconductor package as claimed in claim 9, wherein the first electric contact further comprises a pre-solder disposed on the pad.

11. The semiconductor package as claimed in claim 9, wherein the first electric contact further comprises a first solder ball disposed on the pad.

12. The semiconductor package as claimed in claim 3, further comprising:
another chip mounted and electrically connected to the lower surface of the substrate; and
a plurality of second solder balls disposed on the lower surface of the substrate, wherein the another chip is surrounded by the second solder balls.

13. The semiconductor package as claimed in claim 1, wherein the molding compound exposes the upper surface of the interposer.

14. The semiconductor package as claimed in claim 1, wherein the molding compound exposes the first electric contacts of the interposer.

15. The semiconductor package as claimed in claim 14, wherein the molding compound comprises a plurality of via holes, the via holes exposing the first electric contacts of the interposer.

16. A method for manufacturing a semiconductor package comprising the following steps of:
providing a substrate, wherein the substrate has an upper surface and a lower surface opposite to the upper surface;
electrically connecting a chip to the upper surface of the substrate;
disposing an interposer on the chip and electrically connecting the interposer to the substrate, wherein the interposer has an upper surface and a lower surface, the lower surface is opposite to the upper surface and faces the chip, the interposer comprises an embedded component and a plurality of electric contacts, the embedded component is located between the upper and lower surfaces, and the electric contacts are located on the upper surface of the interposer, the interposer further comprises a silicon substrate and a molding compound material, the silicon substrate includes an opening, the embedded component is disposed within the opening and secured by the molding compound material, and the interposer further comprises upper circuit layers formed on the upper surface; and
applying a molding compound on the upper surface of the substrate to seal the chip and cover the lower surface of the interposer.

17. The method as claimed in claim 16, further comprises the following step:
forming a plurality of via holes in the molding compound, the via holes exposing the electric contacts of the interposer.

18. A stacked package device comprising:
a bottom package comprising:
a first substrate having an upper surface and a lower surface opposite to the upper surface;
a first chip electrically connected to the first substrate;
an interposer disposed on the first chip and electrically connected to the first substrate, wherein the interposer has an upper surface and a lower surface, the lower surface is opposite to the upper surface and faces the first chip, the interposer comprises an embedded component and a plurality of first electric contacts, the embedded component is located between the upper and lower surfaces, and the first electric contacts are located on the upper surface of the interposer; and
a first molding compound sealing the first chip and covering the upper surface of the first substrate and the lower surface of the interposer; and
a top package stacked on the bottom package and comprising:
a second substrate having an upper surface and a lower surface, wherein the lower surface is opposite to the upper surface and electrically connecting to the first electric contacts of the interposer, the interposer further comprises a silicon substrate and a molding compound material, the silicon substrate includes an opening, the embedded component is disposed within the opening and secured by the molding compound material, and the interposer further comprises upper circuit layers formed on the upper surface;
a second chip electrically connected to the second substrate; and
a second molding compound sealing the second chip and covering the upper surface of the second substrate.

19. The stacked package device as claimed in claim 18, wherein the second substrate comprises a plurality of second electrical contacts formed on the lower surface of the second substrate and electrically connected to the first electrical contacts respectively.

20. The stacked package device as claimed in claim 18, wherein the interposer is one of a multi-layer circuit substrate and a silicon substrate with circuit formed therein.

* * * * *